United States Patent
Shin et al.

(10) Patent No.: US 7,893,550 B2
(45) Date of Patent: Feb. 22, 2011

(54) SEMICONDUCTOR PACKAGE COMPRISING ALIGNMENT MEMBERS

(75) Inventors: Na-rae Shin, Yongin-si (KR); Dong-han Kim, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/750,915

(22) Filed: Mar. 31, 2010

(65) Prior Publication Data

US 2010/0187686 A1    Jul. 29, 2010

Related U.S. Application Data

(62) Division of application No. 11/776,734, filed on Jul. 12, 2007, now abandoned.

(30) Foreign Application Priority Data

Sep. 22, 2006    (KR) ................. 10-2006-0092455

(51) Int. Cl.
*H01L 23/544* (2006.01)
(52) U.S. Cl. ............. 257/797; 257/668; 257/E23.179; 438/401; 438/462
(58) Field of Classification Search ........ 257/797, 257/668, E23.179; 438/401, 462
See application file for complete search history.

(56) References Cited

U.S. PATENT DOCUMENTS

| 7,135,771 | B1* | 11/2006 | Khandekar et al. ......... 257/737 |
| 2002/0163068 | A1* | 11/2002 | Asada ...................... 257/690 |
| 2006/0181299 | A1* | 8/2006 | Hirae ...................... 324/765 |

FOREIGN PATENT DOCUMENTS

| JP | 07058244 A | 3/1995 |
| JP | 11102932 A | 4/1999 |
| JP | 2005311250 A | 11/2005 |
| KR | 1020000003306 A | 1/2000 |

* cited by examiner

*Primary Examiner*—Victor Mandala
(74) *Attorney, Agent, or Firm*—Volentine & Whitt, PLLC (57) ABSTRACT

A semiconductor package comprising alignment members is provided. The semiconductor package includes a semiconductor die, first connection terminals disposed on a first surface of the semiconductor die, and a tape substrate including a substrate portion, and second connection terminals disposed on the substrate portion and disposed corresponding to the first connection terminals. The semiconductor package further includes a first alignment member disposed on the first surface of the semiconductor die, and a second alignment member disposed on the substrate portion of the tape substrate and disposed corresponding to the first alignment member.

3 Claims, 6 Drawing Sheets

SEMICONDUCTOR PACKAGE COMPRISING ALIGNMENT MEMBERS

CROSS-REFERENCE-TO RELATED PATENT APPLICATIONS

This is a divisional of application Ser. No. 11/776,734 filed on Jul. 12, 2007, which claims priority to Korean Patent Application No. 10-2006-0092455, filed on Sep. 22, 2006. The subject matter of both of these applications is hereby incorporated by reference in their entirety.

BACKGROUND OF THE INVENTION

1. Field of the Invention

Embodiments of the invention relate to a semiconductor package. In particular, embodiments of the invention relate to a semiconductor package comprising a semiconductor die and a tape substrate and further comprising an alignment member disposed on the semiconductor die and an alignment member disposed on the tape substrate.

2. Description of the Related Art

In an effort to make electronic devices such as portable personal computers and mobile phones lighter and more compact, there is an effort to make semiconductor devices used in those electronic devices smaller and able to perform multiple functions. One method for mounting such a semiconductor device (i.e., a semiconductor die) is to mount the semiconductor die using a flexible tape substrate such as a tape automated bonding (TAB) tape substrate. In the mounting method using the TAB tape substrate, inner leads disposed on a base film and bumps disposed on the semiconductor die are bonded to one another.

In the TAB tape substrate, wiring patterns are formed on the base film as in a chip on film (COF), and inner leads that are to be electrically connected to the wiring patterns are disposed on the base film. Bumps disposed on a semiconductor die are disposed corresponding to the inner leads disposed on the tape substrate, and the bumps are pressed to the inner leads by a pressing apparatus in order to electrically connect the inner leads and the bumps. In a semiconductor package using a conventional TAB tape substrate, in order to precisely connect the inner leads of the tape substrate and the bumps of the semiconductor die, the TAB tape substrate and the semiconductor die must be accurately aligned.

Conventionally, alignment keys for aligning the semiconductor die and the tape substrate were disposed on the semiconductor die and the tape substrate. Thus, the semiconductor die and the tape substrate were precisely aligned using the alignment keys, and the inner leads and the bumps were heated and pressed to connect to one another in an aligned state (i.e., after the semiconductor die and the tape substrate were aligned). Although a semiconductor die can be attached to the tape substrate by die attach equipment when using alignment keys, the tape substrate is deformed due to heat and pressure present during die attachment (i.e., while attaching the semiconductor die and the tape substrate) and misalignment between the tape substrate and the semiconductor die may occur. In particular, a semiconductor package having a relatively fine pitch and a relatively small allowance for deformation may suffer more from such misalignment, which may reduce the accuracy in the assembly of a semiconductor package.

SUMMARY OF THE INVENTION

Embodiments of the invention provide a semiconductor package in which a semiconductor die and a tape substrate may be fixed to one another with more precise alignment.

In one embodiment, the invention provides a semiconductor package comprising a semiconductor die, first connection terminals disposed on a first surface of the semiconductor die, and a tape substrate comprising a substrate portion, and second connection terminals disposed on the substrate portion and disposed corresponding to the first connection terminals. The semiconductor package further comprises a first alignment member disposed on the first surface of the semiconductor die, and a second alignment member disposed on the substrate portion of the tape substrate and disposed corresponding to the first alignment member.

In another embodiment, the invention provides a semiconductor package comprising a semiconductor die, first connection terminals disposed on a first surface of the semiconductor die, and a tape substrate comprising a substrate portion, and second connection terminals disposed on the substrate portion and disposed corresponding to the first connection terminals. The semiconductor package further comprises a first alignment member disposed on the first surface of the semiconductor die, and a second alignment member disposed on the substrate portion of the tape substrate, wherein at least a portion of the first alignment member is disposed between portions of the second alignment member.

In yet another embodiment, the invention provides a semiconductor package comprising a semiconductor die, first connection terminals disposed on a first surface of the semiconductor die, and a tape substrate comprising a substrate portion, and second connection terminals disposed on the substrate portion and disposed corresponding to the first connection terminals. The semiconductor package further comprises a first alignment member disposed on the first surface of the semiconductor die, and a second alignment member disposed on the substrate portion of the tape substrate, wherein at least a portion of the second alignment member is disposed between portions of the first alignment member.

BRIEF DESCRIPTION OF THE DRAWINGS

Embodiments of the invention will be described herein with reference to the accompanying drawings, in which.

DESCRIPTION OF EMBODIMENTS

In the drawings, configurations or the like of some elements are intentionally exaggerated for clarity of description. Also, in the drawings, like reference symbols indicate like or similar elements.

Figure 1A:
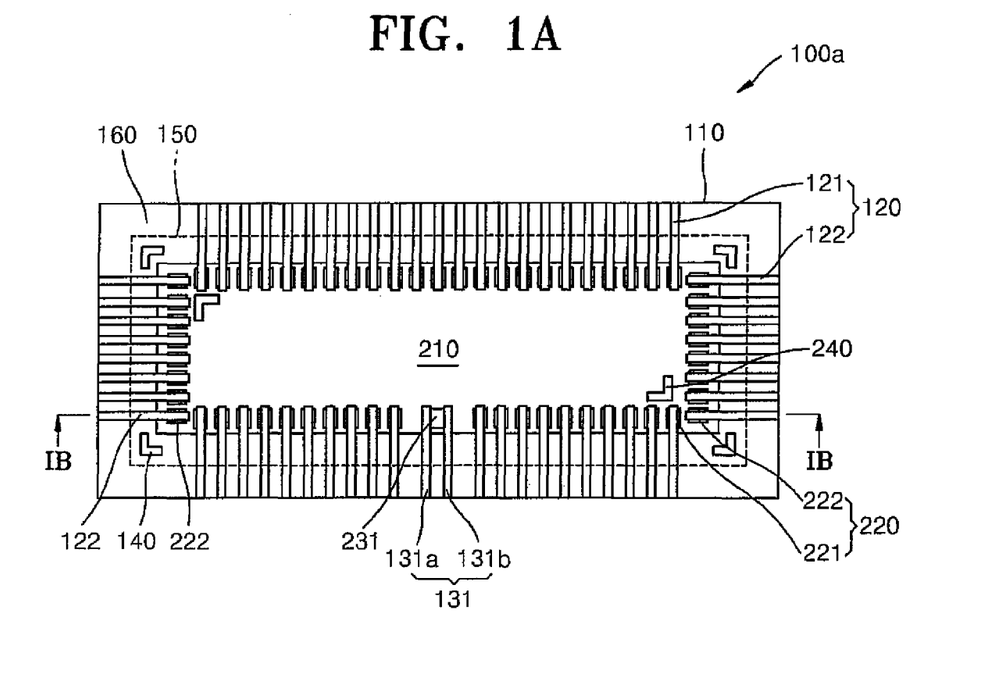
FIG. 1A is a plan view illustrating a semiconductor package in accordance with an embodiment of the invention.
Figure 1B:
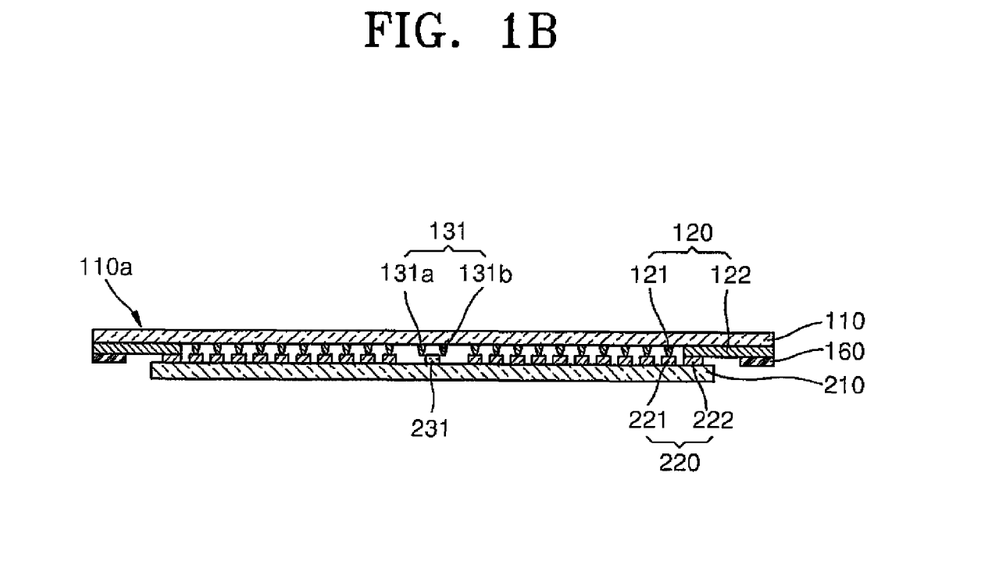
FIG. 1B is a cross-sectional view of the semiconductor package of FIG. 1A, taken along the line IB-IB of FIG. 1A, before a semiconductor die attaching process.
Figure 1C:
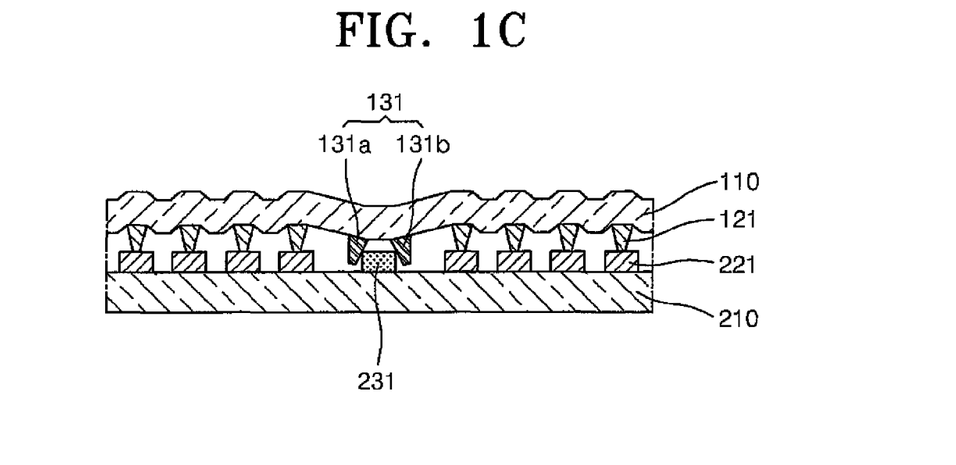
FIG. 1C is a cross-sectional view of the semiconductor package of FIG. 1A, taken along the line IB-IB of FIG. 1A, after the semiconductor die attaching process.

FIG. 1A is a plan view illustrating a semiconductor package 100a in accordance with an embodiment of the invention. FIG. 1B is a cross-sectional view of semiconductor package 100a taken along a line IB-IB of FIG. 1A, and illustrates semiconductor package 100a having an aligned state before semiconductor die 210 and tape substrate 110a are connected to one another (i.e., before a semiconductor die attaching process is performed). FIG. 1C is a cross-sectional view of semiconductor package 100a, taken along line IB-IB of FIG. 1A, and illustrates semiconductor package 100a after semiconductor die 210 and tape substrate 110a have been connected to one another (i.e., after a semiconductor die attaching process has been performed). FIG. 1C illustrates semiconductor package 100a in a connected state. As used herein, a "semiconductor die attaching process" is a process in which a semiconductor die and a tape substrate are attached to one another.

Referring to FIGS. 1A, 1B, and 1C, semiconductor package 100a comprises tape substrate 110a and semiconductor die 210. Tape substrate 110a comprises a substrate portion 110 formed from a material such as polyimide film and second connection terminals 120 disposed on substrate portion 110. Second connection terminals 120 comprise a plurality of first inner leads 121 disposed along a first long side of semiconductor die 210, and a plurality of second inner leads 122 disposed along a first short side of semiconductor die 210. As used herein, a "long side" of semiconductor die 210 is a side of an upper surface of semiconductor die 210 that is one of the longest sides of semiconductor die 210 (i.e., there is no side longer than any of the "long sides"). In addition, a "short side" of semiconductor die 210 is a side of an upper surface of semiconductor die 210 that is shorter than each of the long sides. Although it is not shown in the drawings, circuit patterns (i.e., circuit distributions) may be disposed on substrate portion 110 and electrically connected to second connection terminals 120. In addition, second connection terminals 120 are covered and protected by solder resist 160, and portions of second connection terminals 120 that are to be connected to semiconductor die 210 are exposed through an opening 150 in solder resist 160.

Semiconductor die 210 is mounted on a die mounting area of substrate portion 110. First connection terminals 220 are disposed on the upper surface of semiconductor die 210 and are disposed corresponding to second connection terminals 120 of tape substrate 110a. First connection terminals 220 comprise a plurality of first bumps 221 disposed along the first long side of semiconductor die 210 and disposed corresponding to first inner leads 121 of second connection terminals 120, and a plurality of second bumps 222 disposed along the first short side of semiconductor die 210 and disposed corresponding to second inner leads 122 of second connection terminals 120. Although it is not shown in the drawings, semiconductor die 210, first connection terminals 220, and second connection terminals 120 can be protected from elements disposed outside of semiconductor package 100a (i.e., protected from the outside) by an insulating material.

Semiconductor package 100a further comprises a first alignment member 231 disposed on semiconductor die 210, and a second alignment member 131 disposed on tape substrate 110a and disposed corresponding to first alignment member 231. In the embodiment illustrated in FIG. 1, first alignment member 231 comprises a dummy bump disposed between two of first bumps 221 of first connection terminals 220 disposed on semiconductor die 210. Second alignment member 131 comprises a pair of dummy inner leads 131a and 131b. In addition, second alignment member 131 is disposed between two of first inner leads 121 of second connection terminals 120 and is disposed on substrate portion 110. In addition, the pair of dummy inner leads 131a and 131b are disposed such that first alignment member 231 may be inserted between dummy inner leads 131a and 131b. As used herein, a "dummy bump" is a dummy pattern having the shape of a bump, and a "dummy lead" is a dummy pattern having the shape of a lead. In addition, a "dummy inner lead," which is also a dummy pattern having the shape of a lead, may be referred to herein as simply a dummy lead.

The dummy bump of first alignment member 231 may have substantially the same shape as each of first and second bumps 221 and 222, and each of dummy inner leads 131a and 131b of second alignment member 131 may have substantially the same shape as each of first and second inner leads 121 and 122. First alignment member 231 may be disposed in a center portion of semiconductor die 210 or between two of second bumps 221 disposed along the first short side of semiconductor die 210. In addition, at least one more first alignment member 231 may be disposed between two of first bumps 221, between two of second bumps 222, in the center portion of semiconductor die 210, and/or at a similar position.

Alignment keys 240 and 140 are disposed on semiconductor die 210 and tape substrate 110a, respectively, for aligning semiconductor die 210 and tape substrate 110a in relation to one another when attaching semiconductor die 210 to tape substrate 110a. Two first alignment keys 240 are disposed at inner portions of semiconductor die 210 corresponding to two corners of semiconductor die 210, respectively, wherein the two corners are separated from one another diagonally. In addition, first alignment keys 240 each have a shape similar to the capital letter "L". Each of second alignment keys 140 also has a shape similar to the capital letter "L". In addition, second alignment keys 140 are disposed on substrate portion 110, are disposed outside of corners of semiconductor die 210, and are exposed through opening 150. First and second alignment keys 240 and 140 may have various shapes and may be disposed at various positions of semiconductor die 210 and substrate portion 110, respectively, in accordance with what is suitable for the semiconductor package in which they are disposed.

Tape substrate 110a and semiconductor die 210 are pressed and heated in an aligned state, which is shown in FIG. 1B, to connect second connection terminals 120 of tape substrate 110a and first connection terminals 220 disposed on semiconductor die 210 with one another. When tape substrate 110a and semiconductor die 210 are pressed and heated, deflection of substrate portion 110 of tape substrate 110a can occur in regions of semiconductor die 210 in which first connection terminals 220 are not formed, and/or in regions in which inner leads 221 and 222 are separated by relatively large intervals. Therefore, although a semiconductor die attaching process is performed on tape substrate 110a and semiconductor die 210 after tape substrate 110a and semiconductor die 210 have been precisely aligned with one another using first and second alignment keys 240 and 140, misalignment may still occur between tape substrate 110a and semiconductor die 210 when they are heated and pressed, and that misalignment may result in defective connections between first terminals 220 and second terminals 120.

However, in the embodiment illustrated in FIG. 1, at least a portion of the dummy bump of first alignment member 231 is inserted between dummy leads 131a and 131b so that, when tape substrate 110a and semiconductor die 210 are subsequently attached to one another, they may be attached to one another with more precise alignment. As shown in FIG. 1C, in accordance with an embodiment of the invention, after the semiconductor die attaching process, at least a portion of first alignment member 231 is interposed between dummy leads 131a and 131b of second alignment member 131. That is, at least a portion of first alignment member 231 is disposed between portions (i.e., dummy leads 131a and 131b) of second alignment member 131. After the semiconductor die attaching process (i.e., after attaching tape substrate 110a and semiconductor die 210), gaps between first alignment member 231 and second alignment member 131 must be less than about 2 μm. Preferably, first alignment member 231 and second alignment member 131 are disposed such that at least a portion of a side surface of first alignment member 231 is in contact with portions of side surfaces of dummy leads 131a and 131b of second alignment member 131. In a semiconductor package having a relatively fine pitch (i.e., in a semiconductor package having elements disposed with a relatively fine pitch), when the gaps between first alignment member 231 and second alignment member 131 are greater than 2 μm, first alignment member 231 and second alignment member 131 cannot properly aid the post-attaching alignment of tape substrate 110a and semiconductor die 210. As used herein "post-attaching alignment" means the alignment of first and second components after they have been attached to one another.

Figure 2A:
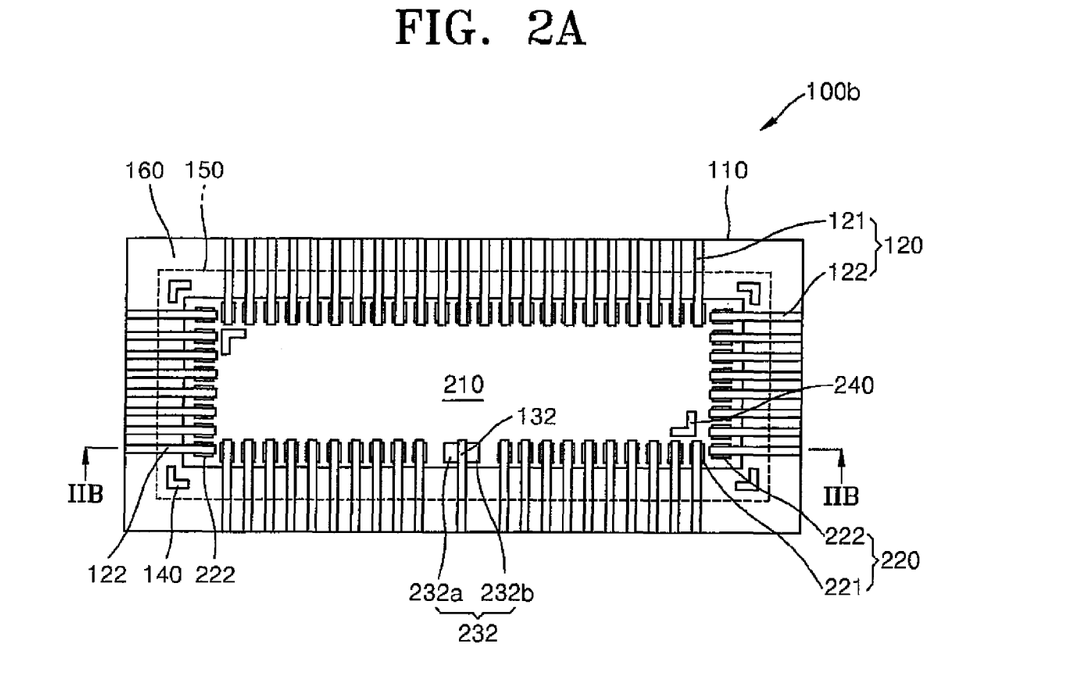
FIG. 2A is a plan view illustrating a semiconductor package in accordance with another embodiment of the invention.
Figure 2B:
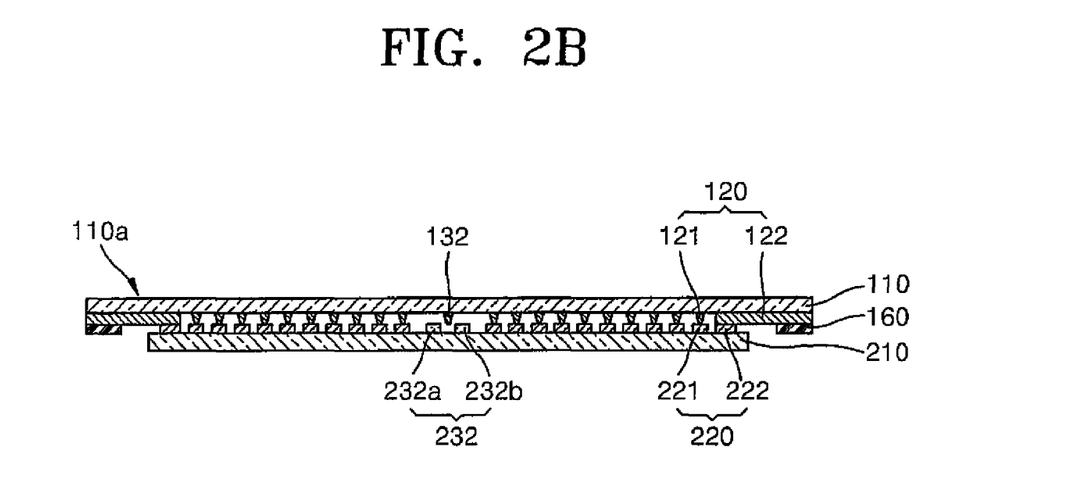
FIG. 2B is a cross-sectional view of the semiconductor package of FIG. 2A, taken along the line IIB-IIB of FIG. 2A, before a semiconductor die attaching process.
Figure 2C:
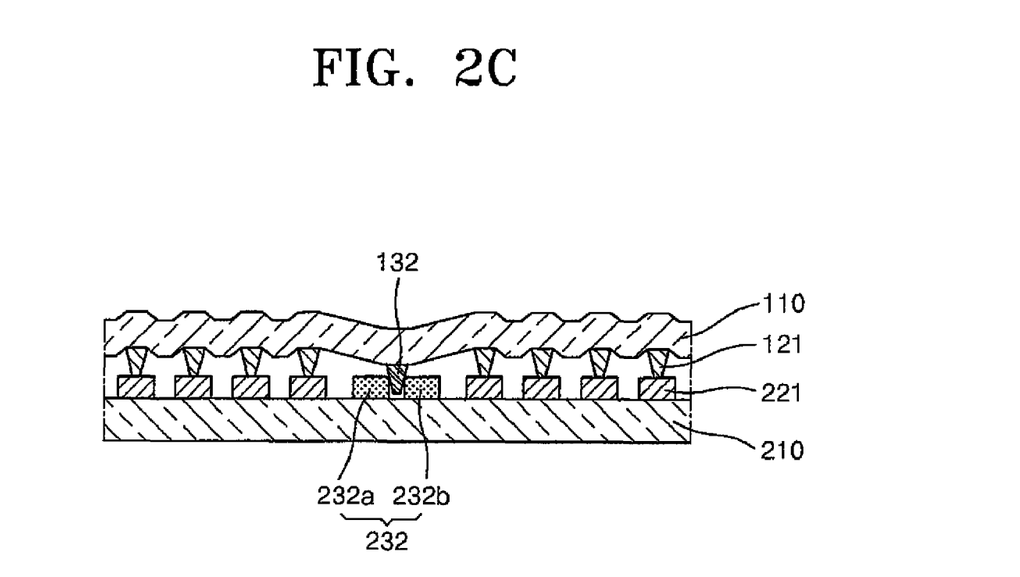
FIG. 2C is a cross-sectional view of the semiconductor package of FIG. 2A, taken along the line IIB-IIB of FIG. 2A, after the semiconductor die attaching process.

FIG. 2A is a plan view illustrating a semiconductor package 100b in accordance with another embodiment of the invention. FIG. 2B is a cross-sectional view of semiconductor package 100b, taken along the line IIB-IIB of FIG. 2A, before a semiconductor die 210 and a tape substrate 110a are connected to one another. FIG. 2B also shows semiconductor package 100b in an aligned state. FIG. 2C is a cross-section view of semiconductor package 100b, taken along the line IIB-IIB of FIG. 2A, after semiconductor die 210 and tape substrate 110a have been connected to one another. Semiconductor package 100b shown in FIGS. 2A-2C is the same as semiconductor package 100a shown in FIGS. 1A-1C, except that the respective structures of a first alignment member 232 and a second alignment member 132 are different from the respective structures of first and second alignment members 231 and 131 of semiconductor package 100a.

Referring to FIGS. 2A-2C, semiconductor package 100b comprises tape substrate 110a and semiconductor die 210. First alignment member 232 is disposed on semiconductor die 210, and tape substrate 110a comprises second alignment member 132 disposed corresponding to first alignment member 232. First alignment member 232 comprises a pair of dummy bumps 232a and 232b, and second alignment member 132 comprises a dummy inner lead that is disposed such that at least a portion of the dummy inner lead may be inserted between dummy bumps 232a and 232b. Dummy bumps 232a and 232b each have substantially the same shape as each of first and second bumps 221 and 222 of first connection terminals 220, and the dummy inner lead has substantially the same shape as each of first and second inner leads 121 and 122 of second connection terminals 120.

In the embodiment illustrated in FIG. 2, at least a portion of the dummy inner lead of second alignment member 132 is inserted between the pair of dummy bumps 232a and 232b of first alignment member 232, and then tape substrate 110a and semiconductor die 210 are fixed to one another. As shown in FIG. 2C, in accordance with an embodiment of the invention, after the semiconductor die attaching process, at least a portion of the dummy inner lead of second alignment member 132 is interposed between dummy bumps 232a and 232b of first alignment member 232. That is, at least a portion of second alignment member 132 is disposed between portions (i.e., dummy bumps 232a and 232b) of first alignment member 232. After the die attachment process, a gap between first alignment member 232 and second alignment member 132 must be less than about 2 μm. Preferably, after the die attachment process, first alignment member 232 and second alignment member 132 are disposed such that at least portions of side surfaces of first alignment member 232 and second alignment member 132 are in contact with one another.

Figure 3A:
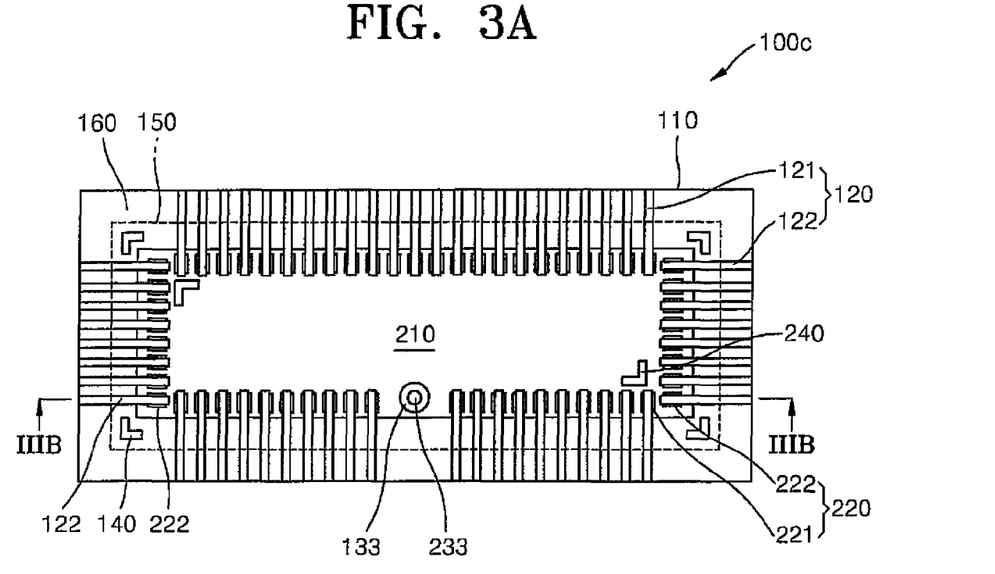
FIG. 3A is a plan view illustrating a semiconductor package in accordance with still another embodiment of the invention.
Figure 3B:
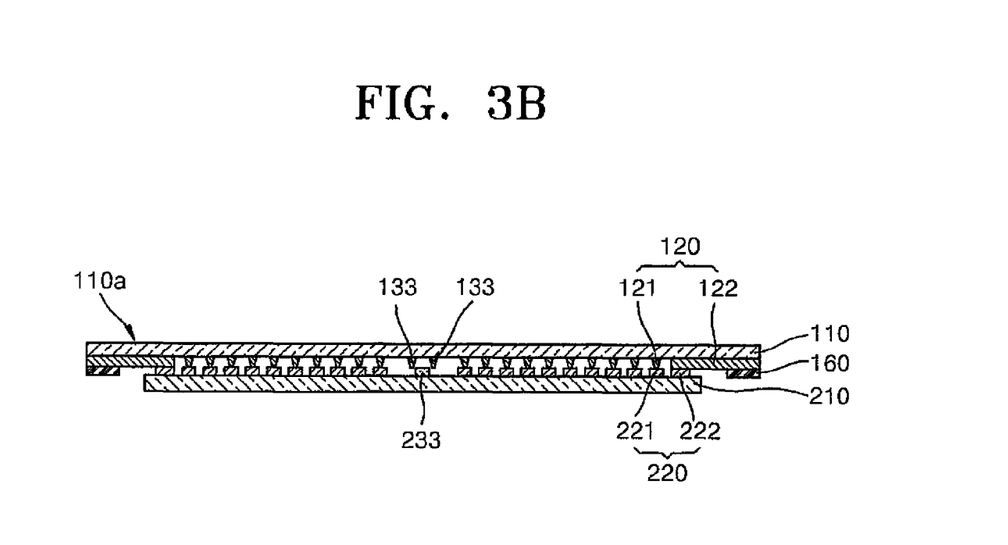
FIG. 3B is a cross-sectional view of the semiconductor package of FIG. 3A, taken along the line IIIB-IIIB of FIG. 3A, before a semiconductor die attaching process.
Figure 3C:
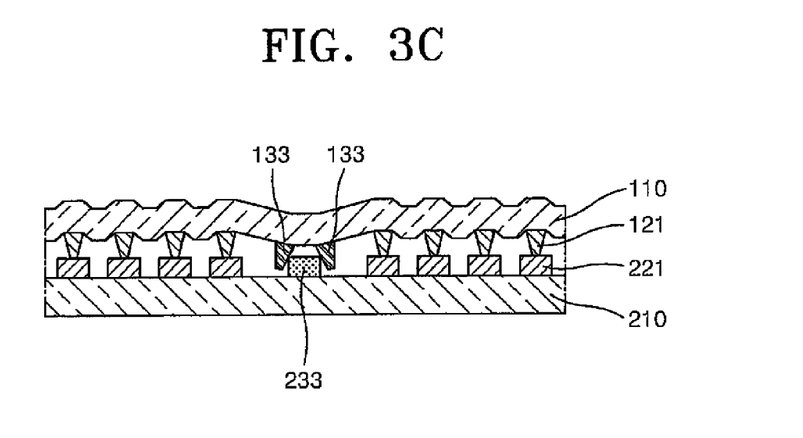
FIG. 3C is a cross-sectional view of the semiconductor package of FIG. 3A, taken along the line IIIB-IIIB of FIG. 3A, after the semiconductor die attaching process.

FIG. 3A is a plan view illustrating a semiconductor package 100c in accordance with still another embodiment of the invention. FIG. 3B is a cross-sectional view of semiconductor package 100c, taken along the line IIIB-IIIB of FIG. 3A, before a semiconductor die 210 and a tape substrate 110a are connected to one another. In addition, FIG. 3B illustrates semiconductor package 100c in an aligned state. FIG. 3C is a cross-sectional view of semiconductor package 100c, taken along the line IIIB-IIIB of FIG. 3A, after semiconductor die 210 and tape substrate 110a have been connected to one another. Semiconductor package 100c shown in FIGS. 3A-3C is the same as semiconductor package 100a shown in FIGS. 1A-1C, except that the respective structures of a first alignment member 233 and a second alignment member 133 are different from the respective structures of first and second alignment members 231 and 131 of semiconductor package 100a.

Referring to FIGS. 3A-3C, semiconductor package 100c comprises tape substrate 110a and semiconductor die 210. A first alignment member 233 is disposed on semiconductor die 210, and tape substrate 110a comprises a second alignment member 133 disposed corresponding to first alignment members 233. In addition, first alignment member 233 comprises a dummy pattern having a cylindrical shape (i.e., a circular projecting shape), and second alignment member 133 comprises an annular dummy pattern that may surround at least a portion first alignment member 233.

In the embodiment illustrated in FIG. 3, at least a portion of first alignment member 233 may be inserted into second alignment member 133 so that, when tape substrate 110a and semiconductor die 210 are subsequently attached to one another, they may be attached to one another with more precise alignment. As illustrated in FIG. 3C, in accordance with an embodiment of the invention, after the semiconductor die attaching process, second alignment member 133 surrounds at least a portion of first alignment member 233. That is, at least a portion of first alignment member 233 is disposed between portions of second alignment member 133 (e.g., portions of second alignment member 133 disposed opposite one another). After tape substrate 110a and semiconductor die 210 are attached to one another (i.e., after the semiconductor die attaching process), a gap between first alignment member 233 and second alignment member 133 must be less than about 2 µm. Preferably, first alignment member 233 and second alignment member 133 are disposed such that at least a portion of a side surface of first alignment member 233 and at least a portion of a side surface of second alignment member 133 are in contact with one another. Although, in the embodiment illustrated in FIG. 3, first alignment member 233 has a cylindrical structure and second alignment member 133 has an annular structure, first and second alignment members 233 and 133 may respectively have any structures satisfying the condition that first alignment member 233 may be inserted into second alignment member 133 at least partially.

Figure 4A:
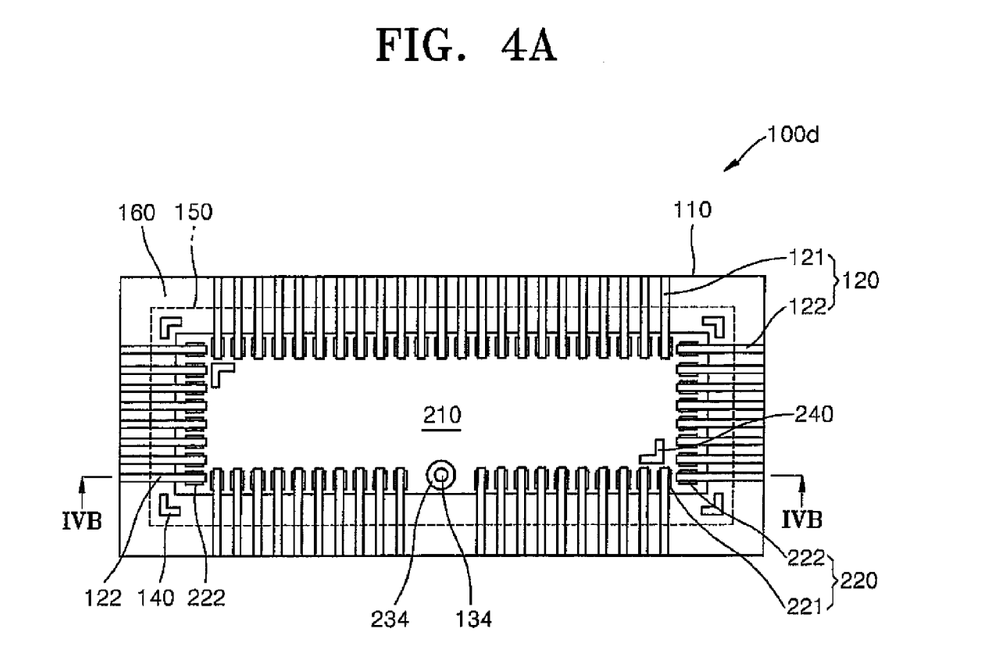
FIG. 4A is a plan view illustrating a semiconductor package in accordance with still another embodiment of the invention.
Figure 4B:
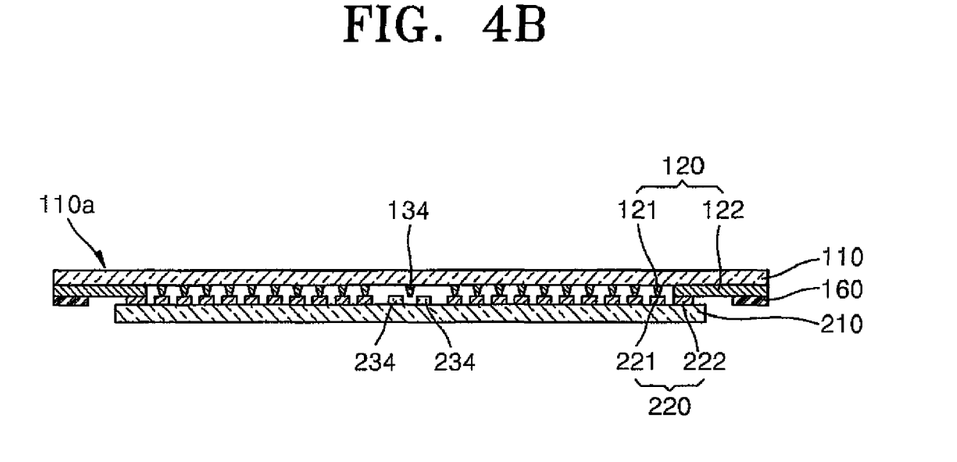
FIG. 4B is a cross-sectional view of the semiconductor package of FIG. 4A, taken along the line IVB-IVB of FIG. 4A, before a semiconductor die attaching process; and, FIG. 4C is a cross-sectional view of the semiconductor package of FIG. 4A, taken along the line IVB-IVB of FIG. 4A, after the semiconductor die attaching process.
Figure 4C:
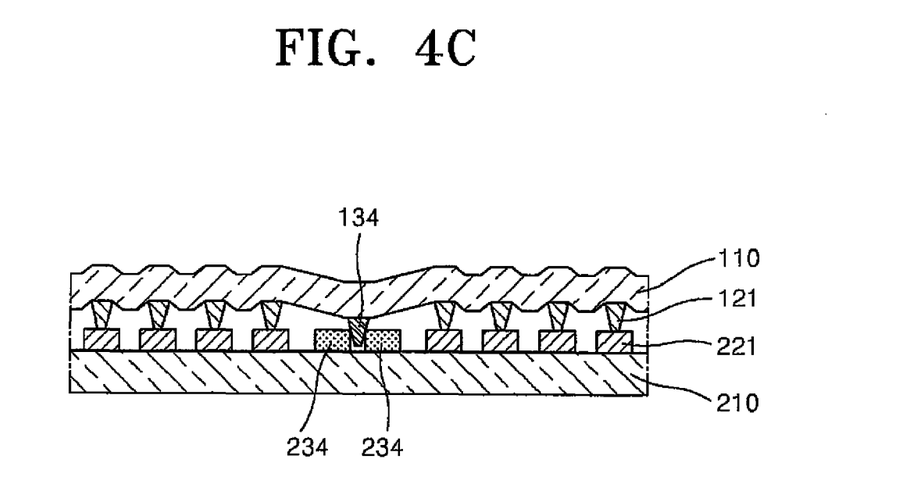

FIG. 4A is a plan view of a semiconductor package 100d in accordance with still another embodiment of the invention. FIG. 4B is a cross-sectional view of semiconductor package 100d taken along the line IVB-IVB of FIG. 4A before a semiconductor die 210 and a tape substrate 110a are connected to one another. In addition, FIG. 4B illustrates semiconductor package 100d in an aligned state. FIG. 4C is a cross-sectional view of semiconductor package 100d taken along the line IVB-IVB of FIG. 4A after semiconductor die 210 and tape substrate 110a are connected to one another. Semiconductor package 100d shown in FIGS. 4A, 4B, and 4C is the same as semiconductor package 100a shown in FIGS. 1A, 1B, and 1C except that the respective structures of first and second alignment members 234 and 134 of semiconductor package 100d are different from the respective structures of first and second alignment members 231 and 131 of semiconductor package 100a.

Referring to FIGS. 4A, 4B, and 4C, semiconductor package 100d comprises tape substrate 110a and semiconductor die 210. A first alignment member 234 is disposed on semiconductor die 210, and tape substrate 110a comprises a second alignment member 134 disposed corresponding to first alignment member 234. In addition, second alignment member 134 comprises a dummy pattern having a cone-like shape (i.e., a shape similar to that of a cone), and first alignment member 234 comprises an annular dummy pattern that may surround at least a portion of second alignment member 134.

In the embodiment illustrated in FIG. 4, at least a portion of second alignment member 134 may be inserted into first alignment member 234 so that, when tape substrate 110a and semiconductor die 210 are subsequently attached to one another, they may be attached to one another with more precise alignment. As shown in FIG. 4C, in accordance with an embodiment of the invention, after the semiconductor die attaching process, first alignment member 234 surrounds at least a portion of second alignment member 134 (i.e., at least a portion of second alignment member 134 has been inserted into first alignment member 234). That is, at least a portion of second alignment member 134 is disposed between portions of first alignment member 234 (e.g., portions of first alignment member 234 disposed opposite one another). After tape substrate 110a and semiconductor die 210 are attached to one another (i.e., after the semiconductor die attaching process), a gap between first alignment member 234 and second alignment member 134 must be less than about 2 µm. Preferably, first alignment member 234 and second alignment member 134 are disposed such that at least a portion of a side surface of first alignment member 234 and at least a portion of a side surface of second alignment member 134 are in contact with one another. Although, in the embodiment illustrated in FIG. 4, first alignment member 234 has a cone-like structure and second alignment member 134 has an annular structure, first and second alignment members 234 and 134 may respectively have any structures satisfying the condition that second alignment member 134 may be inserted into first alignment member 234 at least partially.

In accordance with the embodiments described above, at least one dummy pattern is formed on a COF type of TAB tape substrate and at least one dummy pattern is formed on a semiconductor die that is to be mounted on a TAB tape substrate to improve the post-attaching alignment of the TAB tape substrate and a semiconductor die. However, embodiments of the invention may also be applied to semiconductor packages in which a semiconductor die is attached to any one of various types of tape substrates.

In a semiconductor package in accordance with an embodiment of the invention, at least one dummy pattern is formed on a semiconductor die and at least one dummy pattern is formed on a tape substrate on which the semiconductor die is mounted so that the post-attaching alignment of the semiconductor die and the tape substrate may be improved, and to reduce deformation of the tape substrate due to pressure and heat. Accordingly, alignment of connection terminals of the semiconductor die and the tape substrate after the semiconductor die and the tape substrate are connected to one another may be improved, and therefore assembly accuracy of the corresponding semiconductor package may be improved.

Although embodiments of the invention have been described herein, various changes may be made to the embodiments by one of ordinary skill in the art without departing from the scope of the invention as defined by the accompanying claims.

What is claimed is:

1. A semiconductor package comprising:
   a semiconductor die;
   first connection terminals disposed on a first surface of the semiconductor die;
   a tape substrate comprising a substrate portion, and second connection terminals disposed on the substrate portion and disposed corresponding to the first connection terminals;
   a first alignment member disposed on the first surface of the semiconductor die; and,
   a second alignment member disposed on the substrate portion of the tape substrate and disposed corresponding to the first alignment member,
   wherein at least one of first and second alignment member has annular shape.

2. The semiconductor package of claim 1, wherein:
   the first alignment member comprises a cylindrical dummy pattern; and,
   the second alignment member comprises an annular dummy pattern surrounding at least a portion of the cylindrical dummy pattern.

3. The semiconductor package of claim 1, wherein:
   the second alignment member comprises a cone-like dummy pattern; and,
   the first alignment member comprises an annular dummy pattern surrounding at least a portion of the second alignment member.

* * * * *